United States Patent
Park

(10) Patent No.: US 9,583,186 B2
(45) Date of Patent: *Feb. 28, 2017

(54) NON-VOLATILE MEMORY APPARATUS SENSING CURRENT CHANGING ACCORDING TO DATA STORED IN MEMORY CELL

(71) Applicant: SK hynix Inc., Icheon-si, Gyeonggi-do (KR)

(72) Inventor: Chulhyun Park, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/797,247

(22) Filed: Jul. 13, 2015

(65) Prior Publication Data

US 2015/0318039 A1 Nov. 5, 2015

Related U.S. Application Data

(62) Division of application No. 13/921,305, filed on Jun. 19, 2013, now abandoned.

(30) Foreign Application Priority Data

Dec. 21, 2012 (KR) .................... 10-2012-0150160
Dec. 21, 2012 (KR) .................... 10-2012-0150161

(51) Int. Cl.
*G11C 13/00* (2006.01)
*G11C 11/56* (2006.01)

(52) U.S. Cl.
CPC ............ *G11C 13/004* (2013.01); *G11C 11/56* (2013.01); *G11C 13/0002* (2013.01); *G11C 13/0038* (2013.01); *G11C 2211/5645* (2013.01)

(58) Field of Classification Search
CPC ............................ G11C 13/004; G11C 11/56
USPC ................................ 365/148, 157, 158, 163
See application file for complete search history.

(56) References Cited

U.S. PATENT DOCUMENTS

| | | | |
|---|---|---|---|
| 6,678,187 B2 * | 1/2004 | Sugibayashi | G11C 11/16 365/158 |
| 7,894,236 B2 * | 2/2011 | Oh | G11C 5/145 365/148 |
| 9,001,596 B2 * | 4/2015 | Park | G11C 13/0002 365/189.07 |
| 2002/0126524 A1 * | 9/2002 | Sugibayashi | G11C 11/16 365/158 |
| 2009/0067229 A1 * | 3/2009 | Kang | G11C 8/06 365/163 |
| 2011/0026303 A1 * | 2/2011 | Choi | G11C 7/04 365/148 |

(Continued)

*Primary Examiner* — Son Dinh
*Assistant Examiner* — Jerome Leboeuf
(74) *Attorney, Agent, or Firm* — William Park & Associates Ltd.

(57) ABSTRACT

A nonvolatile memory apparatus includes a sensing voltage generation unit, a memory cell, a current copy unit and a data sensing unit. The sensing voltage generation unit provides a sensing voltage with a constant level, to a sensing node. The memory cell receives the sensing voltage from the sensing node. The current copy unit generates copied current with substantially the same magnitude as sensing current which flows through the memory cell. The data sensing unit senses the copied current and generates a multi-bit data output signal.

10 Claims, 15 Drawing Sheets

(56) References Cited

U.S. PATENT DOCUMENTS

| | | | |
|---|---|---|---|
| 2011/0170332 A1* | 7/2011 | Oh | G11C 5/145 |
| | | | 365/148 |
| 2011/0317479 A1* | 12/2011 | Yang | G11C 7/18 |
| | | | 365/158 |
| 2014/0112056 A1* | 4/2014 | Tsuji | G11C 8/08 |
| | | | 365/148 |

* cited by examiner

NON-VOLATILE MEMORY APPARATUS SENSING CURRENT CHANGING ACCORDING TO DATA STORED IN MEMORY CELL

CROSS-REFERENCES TO RELATED APPLICATION

The present application claims priority under 35 U.S.C. §119(a) to Korean application numbers 10-2012-0150160 and 10-2012-0150161, filed on Dec. 21, 2012, in the Korean Intellectual Property Office, which are incorporated herein by reference in their entirety.

BACKGROUND

1. Technical Field

Various embodiments relate to a semiconductor apparatus, and more particularly, to a memory apparatus which includes nonvolatile memory cells.

2. Related Art

A conventional DRAM includes a memory cell constituted by a capacitor, and data is stored by charging or discharging charges to and from the memory cell. However, since the capacitor has leakage current due to the characteristics thereof, the DRAM has a disadvantage in that it is a volatile memory. In order to overcome the disadvantage, memories which are nonvolatile and do not need the retention of data have been developed. In particular, attempts have continuously been made to realize nonvolatility by modifying the structure of a memory cell. One of these attempts is a resistive memory apparatus which includes a resistive memory cell. The resistive memory apparatus may store multi-level data according to a resistance distribution of the resistive memory cell.

FIG. 1 is a diagram schematically showing the configuration of a conventional nonvolatile memory apparatus 10. In FIG. 1, the conventional nonvolatile memory apparatus 10 includes a memory cell 11 and first to fourth transistors N1, N2, N3 and N4. The memory cell 11 is formed of a resistive substance of which resistance value changes according to a temperature or current, and has different resistance values according to the data stored therein. Also, the memory cell 11 includes a diode to allow current to flow in one direction.

The first transistor N1 supplies sensing current to sense the data stored in the memory cell 11. The first transistor N1 receives a bias voltage VB and applies a power supply voltage VPPSA to a sensing node SAI. The second transistor N2 is turned on in response to a clamping signal VCLAMP and serves to control the voltage applied to the memory cell 11 not to exceed a threshold. The third transistor N3 is turned on in response to a bit line select signal BLS when a bit line to which data access is to be implemented is selected. The fourth transistor N4 is turned on in response to a word line select signal WLS when a word line to which data access is to be implemented is selected.

FIG. 2 is a diagram schematically showing the configuration of another conventional nonvolatile memory apparatus 20. The conventional nonvolatile memory apparatus 20 includes a sense amplifier 22 in addition to the configuration of the nonvolatile memory apparatus 10 of FIG. 1, to sense multi-level data stored in a memory cell. Thus, the same reference characters of FIG. 1 will be used throughout FIG. 2 to refer to the same or like parts. The sense amplifier 22 is connected with a sensing node SAI and receives a sensing voltage VSEN from the sensing node SAI. The sense amplifier 22 compares the sensing voltage VSEN with first to third reference voltages REF1, REF2 and REF3, and generates a data output signal DOUT.

The conventional nonvolatile memory apparatuses 10 and 20 sense the data stored in memory cells 11 and 21 by changing the voltage of the sensing node SAI. The first transistor N1 is turned on when the bias voltage VB is applied, and is configured to supply a constant amount of current to the sensing node SAI. The current flows through the memory cells 11 and 21. Accordingly, the voltage level of the sensing node SAI changes according to the resistance values of the memory cells 11 and 21. That is to say, when the resistance values of the memory cells 11 and 21 are large, the voltage of the sensing node SAI has a high level, and when the resistance values of the memory cells 11 and 21 are small, the voltage of the sensing node SAI has a low level. In this way, in the conventional nonvolatile memory apparatuses 10 and 20, the constant amount of current is supplied to the sensing node SAI, and the data stored in the memory cells 11 and 21 are sensed through a change in the voltage level of the sensing node SAI according to the resistance values of the memory cells 11 and 21.

Further, in order to reliably sense a change in the voltage level of the sensing node SAI according to the resistance values of the memory cells 11 and 21, a boosting voltage VPPSA is used as the power supply voltage. In general, the boosting voltage VPPSA may be generated, as a voltage with a level higher than the level of a power supply voltage applied from an outside, through a pumping circuit.

Moreover, the sense amplifier 22 necessarily needs a plurality of reference voltages to sense data stored in the memory cell 21. Namely, when the memory cell 21 stores 2-bit data, total three reference voltages are needed to differentiate 00, 01, 10 and 11.

SUMMARY

A resistive memory apparatus which senses sensing current changing according to data stored in a memory cell, thereby performing a precise data sensing operation, and has an efficient data sensing structure is described herein.

Also, a nonvolatile memory apparatus which can receive sensing current from a memory cell storing multi-level data and can output the data stored in the memory cell as a digital signal is described herein.

In an embodiment of the present invention, a nonvolatile memory apparatus includes: a sensing voltage generation unit configured to provide a sensing voltage with a constant level, to a sensing node; a memory cell configured to receive the sensing voltage from the sensing node; a current copy unit configured to generate copied current with substantially the same magnitude as sensing current which flows through the memory cell; and a data sensing unit configured to sense the copied current and generate a multi-bit data output signal.

In an embodiment of the present invention, a nonvolatile memory apparatus includes: a sensing voltage generation unit configured to provide a sensing voltage with a constant level, to a sensing node; a memory cell connected with the sensing node at one end thereof and configured to receive the sensing voltage; and a data sensing unit connected with the other end of the memory cell and configured to sense sensing current which flows through the memory cell and generate a data output signal.

In an embodiment of the present invention, a nonvolatile memory apparatus includes: a memory cell; a sensing voltage generation unit configured to provide a sensing voltage with a constant level, to a sensing node; a column switch configured to connect one end of the memory cell with a sensing node in response to a bit line select signal; and a data sensing unit configured to receive and sense sensing current which flows through the memory cell, from the other end of the memory cell in response to a word line select signal, and generate a data output signal.

In an embodiment of the present invention, a nonvolatile memory apparatus includes: a memory cell array including a plurality of memory cells having one ends which are respectively connected with a plurality of bit lines and the other ends which are respectively connected with a plurality of word lines; a sensing voltage generation block configured to provide a sensing voltage to the memory cell array; and a data sensing block disposed at a position different from the sensing voltage generation block, and configured to receive and sense sensing current which flows through the memory cells and generate a data output signal.

In an embodiment of the present invention, a nonvolatile memory apparatus includes: a memory cell array including memory cells one ends of which are respectively connected with a plurality of bit lines; a sensing voltage generation block configured to provide a sensing voltage to the memory cell array; and a data sensing block disposed below the memory cell array in a vertical direction, connected with the other ends of the memory cells, and configured to sense current which flows through the memory cells and generate a data output signal.

In an embodiment of the present invention, a memory system includes: a memory controller; and a nonvolatile memory device including a nonvolatile memory apparatus including: a sensing voltage generation unit configured to provide a sensing voltage with a constant level, to a sensing node; a memory cell configured to receive the sensing voltage from the sensing node; a current copy unit configured to generate copied current with substantially the same magnitude as sensing current which flows through the memory cell; and a data sensing unit configured to sense the copied current and generate a multi-bit data output signal.

In an embodiment of the present invention, an electronic device including a nonvolatile memory apparatus and a central processing unit, the nonvolatile memory apparatus including: a sensing voltage generation unit configured to provide a sensing voltage with a constant level, to a sensing node; a memory cell configured to receive the sensing voltage from the sensing node; a current copy unit configured to generate copied current with substantially the same magnitude as sensing current which flows through the memory cell; and a data sensing unit configured to sense the copied current and generate a multi-bit data output signal.

BRIEF DESCRIPTION OF THE DRAWINGS

Features, aspects, and embodiments are described in conjunction with the attached drawings, in which:

FIG. 9 is applied;

DETAILED DESCRIPTION

Hereinafter, a nonvolatile memory apparatus according to the present invention will be described below with reference to the accompanying drawings through various embodiments.

Figure 3:
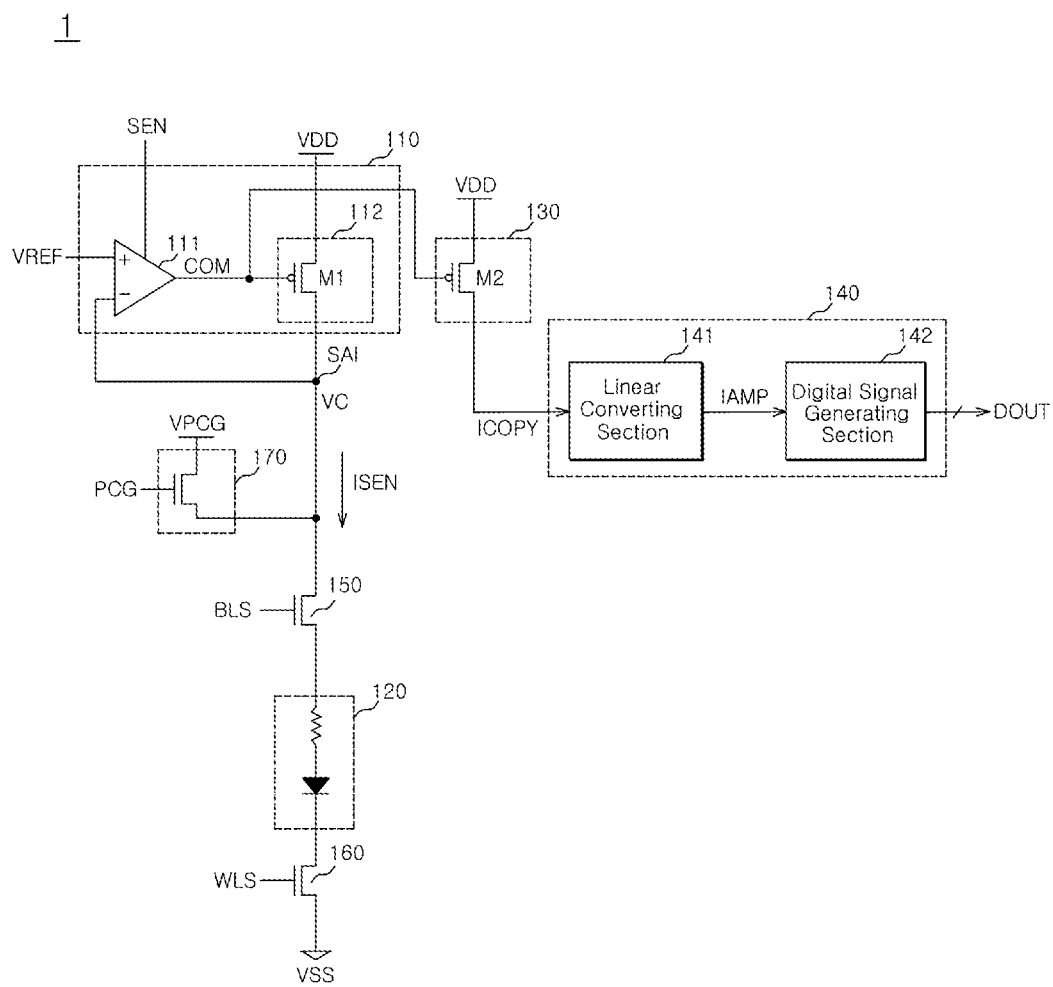
FIG. 3 is a diagram schematically showing the configuration of a nonvolatile memory apparatus in accordance with an embodiment of the present invention.

FIG. 3 is a diagram schematically showing the configuration of a nonvolatile memory apparatus 1 in accordance with an embodiment of the present invention. In FIG. 3, the nonvolatile memory apparatus 1 may include a sensing voltage generation unit 110, a memory cell 120, a current copy unit 130, and a data sensing unit 140. The sensing voltage generation unit 110 may be configured to provide a sensing voltage VC with a constant level to a sensing node SAI in response to a reference voltage VREF and the voltage of the sensing node SAI.

The memory cell 120 may be connected with the sensing node SAI. The memory cell 120 receives the sensing voltage VC with a constant level, from the sensing node SAI. When the memory cell 120 receives the sensing voltage VC, sensing current ISEN flows according to the resistance value of the memory cell 120. That is to say, the amount of the sensing current ISEN changes according to the resistance value of the memory cell 120. The amount of the sensing current ISEN when the resistance value of the memory cell 120 is small is larger than the amount of the sensing current ISEN when the resistance value of the memory cell 120 is large. The memory cell 120 may store multi-bit data, that is, multi-level data.

The current copy unit 130 may be configured to generate copied current ICOPY which has substantially the same magnitude as the sensing current ISEN. The data sensing unit 140 may be configured to sense the copied current ICOPY and generate a multi-bit data output signal DOUT. The data sensing unit 140 senses the copied current ICOPY and provides a multi-bit digital signal as the data output signal DOUT. Accordingly, the data sensing unit 140 may output multi-level data with plural bits, from the sensing current ISEN flowing through the memory cell 120 and the copied current ICOPY.

Figure 1:
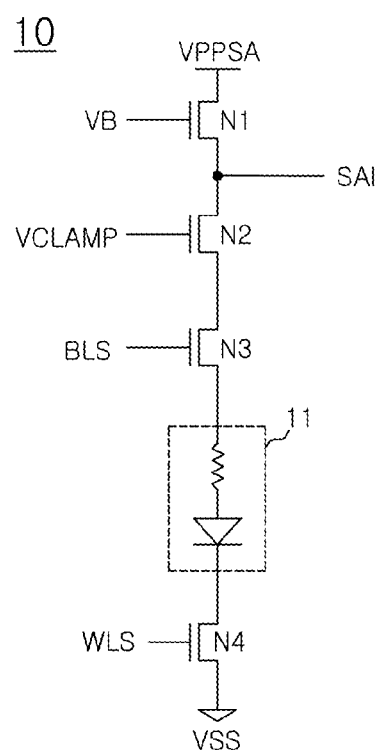
FIG. 1 is a diagram schematically showing the configuration of a conventional nonvolatile memory apparatus.
Figure 2:
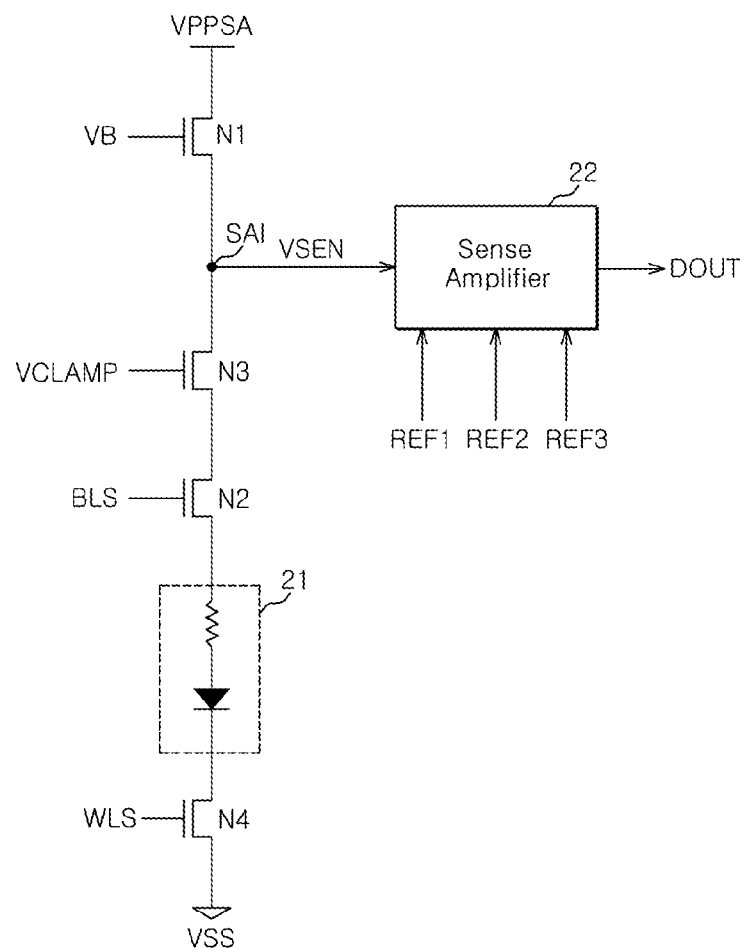
FIG. 2 is a diagram schematically showing the configuration of another conventional nonvolatile memory apparatus.

Each of the conventional nonvolatile memory apparatuses 10 and 20 shown in FIGS. 1 and 2 has a configuration in which the amount of current flowing through the sensing node SAI is fixed, the voltage level of the sensing node SAI is changed according to the resistance value of each of the memory cells 11 and 21, and data is sensed by detecting a change in the voltage level. Conversely, in the embodiments of the present invention shown in FIG. 3, the nonvolatile memory apparatus 1 has a configuration in which the sensing node SAI is retained at a constant voltage level, the amount of current flowing through the sensing node SAI is changed according to the resistance value of the memory cell 120, and data is sensed by detecting a change in the amount of current.

The nonvolatile memory apparatus 1 in accordance with the embodiments of the present invention which detect a change in the amount of current provide various advantages. First, because the nonvolatile memory apparatus 1 detects a change in the amount of current, it is not necessary to provide a voltage of a wide range to the memory cell 120, and thus, it is not necessary to provide a voltage with a high level. In the conventional nonvolatile memory apparatus 10, it is necessary to change the voltage of the sensing node SAI according to the resistance value of the memory cell 11, and a threshold or a reference is needed to detect a change in the voltage. Accordingly, it is necessary to provide a voltage of a wide range such that the high resistant state and the low resistant state of the memory cell 11 can be discriminated. In particular, since the memory cell 21 of the nonvolatile memory apparatus 20 of FIG. 2 stores multi-level data, it is necessary to provide a voltage of a more wide range. Therefore, it can be seen that each of the conventional nonvolatile memory apparatuses 10 and 20 provides a high voltage VPPSA by pumping a power supply voltage as in the case of FIG. 1. However, in the nonvolatile memory apparatus 1 in accordance with the embodiments of the present invention, since the above-described threshold voltage is not needed, it is not necessary to provide a voltage of a wide range, and it is sufficient to provide an external voltage VDD as a power supply voltage. Thus, current consumption may be reduced due to non-use of a high voltage, and a circuit for generating a high voltage may be eliminated.

Further, due to a characteristic of sensing a current change, a time for sensing the data stored in the memory cell 120 may be shortened. That is to say, quick data sensing is possible. Moreover, because an improved structure of providing the sensing voltage VC with a constant level to the sensing node SAI is adopted, an unnecessary element such as a clamping switch in the conventional art may be eliminated.

In addition, due to the fact that the data sensing unit 140 may generate the multi-bit data output signal DOUT by sensing the copied current ICOPY, a reference voltage for sensing the multi-level data stored in the memory cell 120 is not needed.

In FIG. 3, the sensing voltage generation unit 110 may include a comparator 111 and a driver section 112. The comparator 111 may be configured to compare the level of the reference voltage VREF and the voltage level of the sensing node SAI and generate a comparison signal COM. The reference voltage VREF is a voltage which may be biased for data sensing. The sensing voltage generation unit 110 may be enabled in response to a sensing enable signal SEN. The sensing enable signal SEN may be generated from a read command. The read command may include all read commands for data output, such as a normal read command and a verify read command.

The driver section 112 may be configured to provide the sensing voltage VC with a constant level to the sensing node SAI in response to the comparison signal COM. The driver section 112 may include a first transistor M1. Although the first transistor M1 is exemplified as a PMOS transistor in FIG. 3, the present invention is not limited to such (i.e., NMOS, or other transistors, etc.). The first transistor M1 has a gate which receives the comparison signal COM, a source which is applied with the power supply voltage VDD and a drain which may be connected with the sensing node SAI.

The comparator 111 gradually lowers the level of the comparison signal COM until the voltage level of the sensing node SAI becomes the same as the level of the reference voltage VREF. The driver section 112 gradually and strongly drives the sensing node SAI to the level of the power supply voltage VDD in response to the comparison signal COM. The driver section 112 increases the magnitude of the voltage provided to the sensing node SAI, according to the comparison signal COM which is gradually lowered. If the level of the reference voltage VREF and the voltage level of the sensing node SAI become the same with each other, the driver section 112 retains the voltage level of the sensing node SAI. The memory cell 120 may receive the sensing voltage VC with a constant level, and may change the amount of the sensing current ISEN according to its resistance value.

A change in the amount of the sensing current ISEN changes the voltage level of the gate of the first transistor M1, that is, the level of the comparison signal COM. Accordingly, the sensing voltage generation unit 110 provides the sensing voltage VC with a constant level to the sensing node SAI, and the magnitude of the sensing current ISEN may be changed according to the resistance value of the memory cell 120.

In FIG. 3, the current copy unit 130 may generate the copied current ICOPY in response to the comparison signal COM. The current copy unit 130 may include a second transistor M2. The second transistor M2 may be a transistor of substantially the same kind and size as the first transistor M1 constituting the driver section 112. The second transistor M2 has a gate which receives the comparison signal COM, a source which receives the power supply voltage VDD and a drain which outputs the copied current ICOPY.

The data sensing unit 140 may include a linear converting section 141 and a digital signal generating section 142. The linear converting section 141 may be configured to receive the copied current ICOPY and generate a current amplification signal IAMP. Since the sensing current ISEN and the copied current ICOPY are inversely proportional to the resistance value of the memory cell 120, the magnitude of the sensing current ISEN and the copied current ICOPY changes in a log scale. Accordingly, in order to precisely sense a change in the copied current ICOPY, the linear converting section 141 converts the copied current ICOPY with a log scale into the current amplification signal IAMP with a linear scale. The linear converting section 141 may be realized to have the configuration of a log-to-linear converter.

The digital signal generating section 142 may be configured to receive the current amplification signal IAMP and generate the multi-bit data output signal DOUT. The digital signal generating section 142 may convert the current amplification signal IAMP into a multi-bit digital code signal and may generate the multi-bit data output signal DOUT on the basis of the digital code signal.

In FIG. 3, the nonvolatile memory apparatus 1 may further include a column switch 150 and/or a row switch 160. The column switch 150 connects the memory cell 120 and the sensing node SAI with each other in response to a bit line select signal BLS. The row switch 160 may be connected with a word line and forms a current path through the memory cell 120. Namely, the row switch 160 connects the memory cell 120 and the terminal of a ground voltage VSS with each other in response to a word line select signal WLS.

In FIG. 3, the nonvolatile memory apparatus 1 may further include a precharge unit 170. The precharge unit 170 may be configured to provide a precharge voltage VPCG to the sensing node SAI in response to a precharge signal PCG. The precharge voltage VPCG may be a voltage which has a level equal to or lower than the level of the reference voltage VREF. When the precharge signal PCG is enabled, the precharge unit 170 provides the precharge voltage VPCG to the sensing node SAI and raises the voltage level of the sensing node SAI. As the sensing node SAI has the level of the precharge voltage VPCG by the precharge unit 170 before the comparator 111 performs the operation of comparing the level of the reference voltage VREF and the voltage level of the sensing node SAI, it is possible to support a more quick sensing operation. That is to say, since the comparator 111 compares the voltage of the sensing node SAI which is raised by the level of the precharge voltage VPCG and the reference voltage VREF, a time in which the voltage of the sensing node SAI becomes the same as the level of the reference voltage VREF is shortened, and timing at which the driver section 112 provides the voltage VC with a constant level to the sensing node SAI is advanced.

Figure 4:
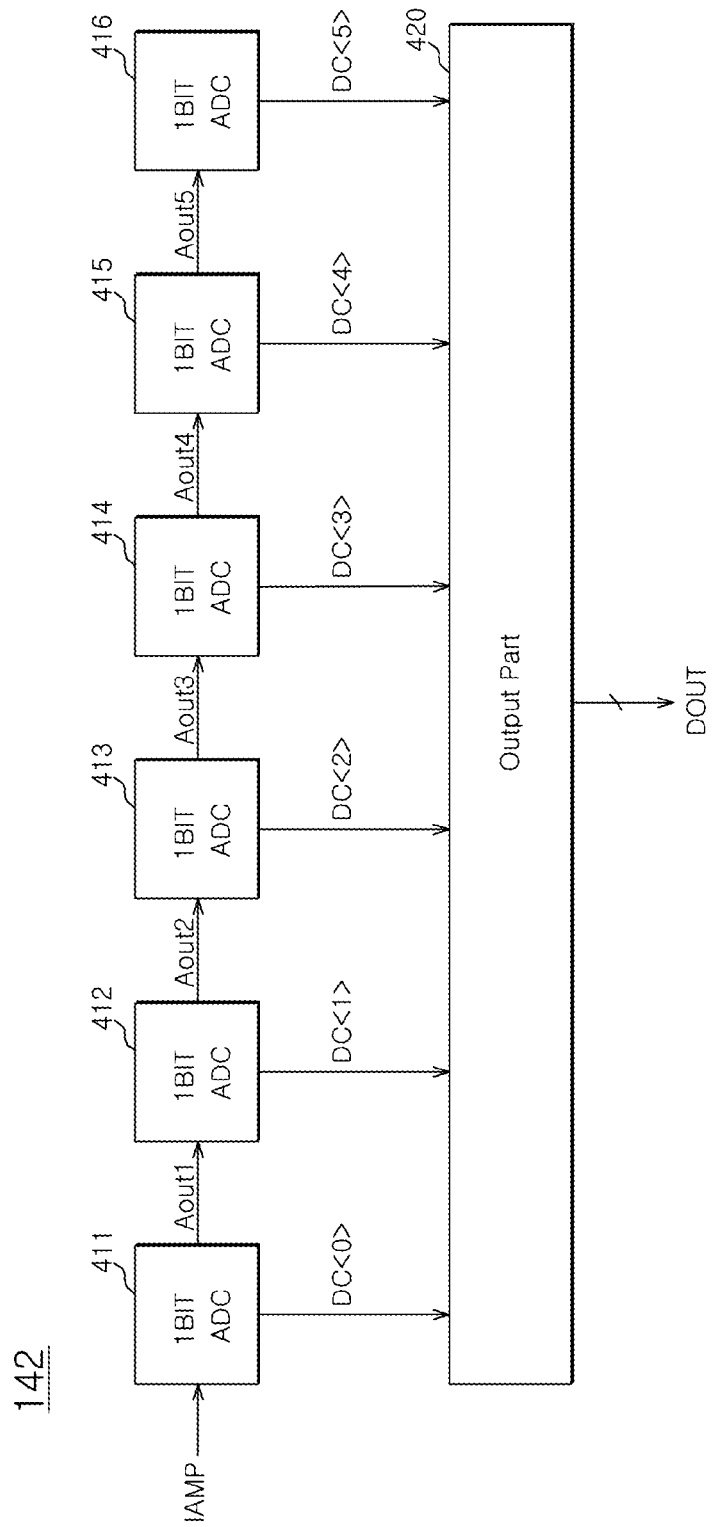
FIG. 4 is a block diagram schematically showing the configuration of an example of an embodiment of the digital signal generating section of FIG. 3.

FIG. 4 is a block diagram schematically showing the configuration of an example of an embodiment of the digital signal generating section 142 of FIG. 3. In FIG. 4, the digital signal generating section 142 may include a plurality of 1-bit analog-to-digital converters (hereinafter, referred to as 1-bit ADCs) 411 to 416, and an output part 420. In FIG. 4, six 1-bit ADCs 411 to 416 are exemplified to generate a 6-bit digital code signal DC<0:5>. First to sixth 1-bit ADCs 411 to 416 are sequentially connected in series, and the first 1-bit ADC 411 receives the current amplification signal IAMP. The first 1-bit ADC 411 generates a first digital output DC<0> and a first analog output Aout1 from the current amplification signal IAMP. The first analog output Aout1 is inputted to the second 1-bit ADC 412, and the first digital output DC<0> is inputted to the output part 420. The second to sixth 1-bit ADCs 412 to 416 output respective analog outputs Aout2 to Aout5 to next stage 1-bit ADCs and output respective digital outputs DC<1:5> to the output part 420. Accordingly, the digital outputs of the first to sixth 1-bit ADCs 411 to 416 form respective 6 bits of the digital code signal DC<0:5>.

The output part 420 may be configured to encode the digital code signal DC<0:5> and generate the multi-bit data output signal DOUT. The output part 420 may encode the digital code signal DC<0:5> in a variety of ways. For example, in the case where the data stored in the memory cell 120 is 2-bit multi-level data, the output part 420 may encode the digital code signal DC<0:5> and generate 2-bit data output signal DOUT, and, in the case where the data stored in the memory cell 120 is 3-bit multi-level data, the output part 420 may encode the digital code signal DC<0:5> and generate 3-bit data output signal DOUT.

Figure 5:
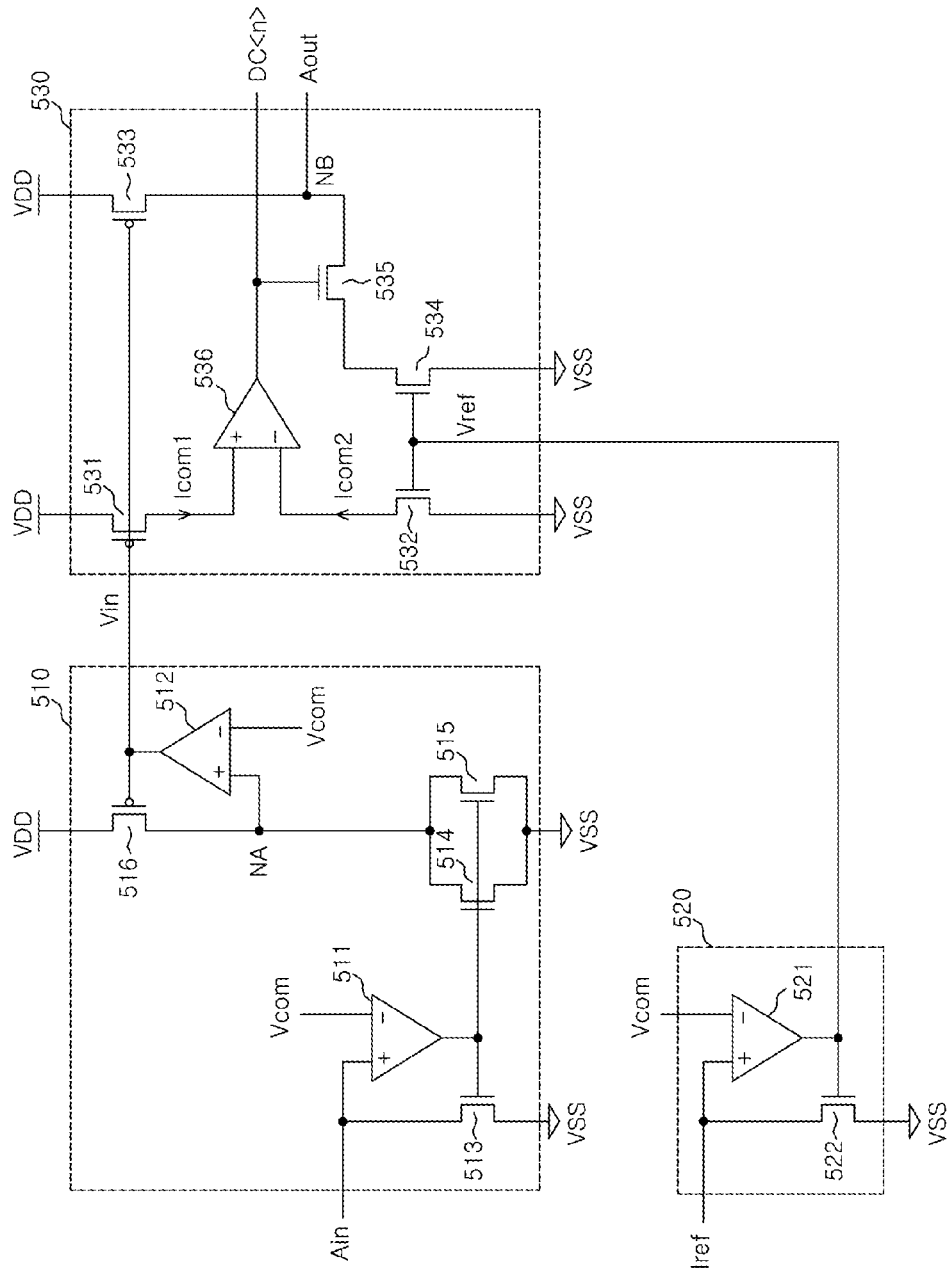
FIG. 5 is a diagram showing the configuration of an example of an embodiment of the 1-bit ADC of FIG. 4.

FIG. 5 is a diagram showing the configuration of an example of an embodiment of the 1-bit ADC of FIG. 4. The first to sixth 1-bit ADCs 411 to 416 of FIG. 4 may have the same configuration. Each 1-bit ADC receives reference current Iref and a reference voltage Vcom which are preset. The 1-bit ADC may include a first comparison voltage generator 510, a second comparison voltage generator 520, and a determiner 530. The first comparison voltage generator 510 may be configured to generate a first comparison voltage Vin which corresponds to two times the magnitude of input current Ain inputted to the 1-bit ADC. The second comparison voltage generator 520 may be configured to receive the reference current Iref and generate a second comparison voltage Vref which corresponds to the magnitude of the reference current Iref. The determiner 530 may be configured to compare first comparison current Icom1 and second comparison current Icom2 which respectively correspond to the first and second comparison voltages Vin and Vref and output a digital output DC<n> and an analog output Aout.

The first comparison voltage generator 510 may include first and second comparators 511 and 512 and first to fourth transistors 513, 514, 515 and 516. The first comparator 511 receives the input current Ain and the reference voltage Vcom. The first transistor 513 has a gate which receives the output of the first comparator 511, a source which may be connected with the ground voltage VSS and a drain which receives the input current Ain. The output terminal of the first comparator 511 becomes a voltage level corresponding to the magnitude of the input current Ain. The second and third transistors 514 and 515 are current mirror types and have gates which respectively receive the output of the first comparator 511 and sources which are respectively connected with the ground voltage VSS. Accordingly, current flowing through a first node NA by the second and third transistors 514 and 515 may be two times the magnitude of the input current Ain. The fourth transistor 516 has a source which receives the power supply voltage VDD and a drain which may be connected with the drains of the second and third transistors 514 and 515. The second comparator 512 may be connected commonly with the drains of the second to fourth transistors 514, 515 and 516 and receives the reference voltage Vcom. The output terminal of the second comparator 512 may be connected with the gate of the fourth transistor 516 and outputs the first comparison voltage Vin. The first comparison voltage Vin has a voltage level corresponding to two times the magnitude of the input current Ain.

The second comparison voltage generator 520 may include a third comparator 521 and a fifth transistor 522. The third comparator 521 receives the reference current Iref and the reference voltage Vcom. The fifth transistor 522 has a gate which receives the output of the third comparator 521, a drain which receives the reference current Iref and a source which may be connected with the ground voltage VSS. The second comparison voltage Vref is generated from the output terminal of the third comparator 521. Accordingly, the second comparison voltage Vref has a voltage level corresponding to the magnitude of the reference current Iref.

The determiner 530 may include sixth to tenth transistors 531 to 535 and a fourth comparator 536. The sixth transistor 531 has a gate which receives the first comparison voltage Vin and a source which receives the power supply voltage VDD. The sixth transistor 531 may generate the first comparison current Icom1 which has substantially the same magnitude as the magnitude of current flowing through the first node NA, by receiving the first comparison voltage Vin.

The seventh transistor 532 has a gate which receives the second comparison voltage Vref and a source which may be connected with the ground voltage VSS. The seventh transistor 532 may generate the second comparison current Icom2 which has substantially the same magnitude as the reference current Iref, by receiving the second comparison voltage Vref.

The fourth comparator 536 may be connected with the respective drains of the sixth and seventh transistors 531 and 532 and generates the digital output DC<n>. The fourth comparator 536 compares the first and second comparison current Icom1 and Icom2 and generates the digital output DC<n>. The digital output DC<n> may be changed according to the relative magnitudes of the first and second comparison current Icom1 and Icom2. In the case where the magnitude of the first comparison current Icom1 is larger than the magnitude of the second comparison current Icom2, the fourth comparator 536 may generate the digital output DC<n> of a high level. Conversely, in the case where the magnitude of the second comparison current Icom2 is larger than the magnitude of the first comparison current Icom1, the fourth comparator 536 may generate the digital output DC<n> of a low level. The digital output DC<n> is outputted to the output part 420.

The eighth transistor 533 has a gate which receives the first comparison voltage Vin, a source which receives the power supply voltage VDD and a drain which may be connected with a second node NB. The eighth transistor 533 may output current with substantially the same magnitude as the magnitude of the current flowing through the first node NA, to the second node NB, by receiving the first comparison voltage Vin. The ninth transistor 534 has a gate which receives the second comparison voltage Vref, a source which may be connected with the ground voltage VSS and a drain which may be connected with one end of the tenth transistor 535. The ninth transistor 534 allows current with substantially the same magnitude as the reference current Iref to flow, by receiving the second comparison voltage Vref.

The tenth transistor 535 has a gate which receives the digital output DC<n>, one end which may be connected with the drain of the ninth transistor 534, and the other end which may be connected with the second node NB. The analog output Aout is outputted from the second node NB. The tenth transistor 535 is turned on according to the digital output DC<n>. In the case where the digital output DC<n> has a high level, the tenth transistor 535 is turned on and connects the ninth transistor 534 with the second node NB. Therefore, current with a magnitude, which is obtained through subtracting the magnitude of the current generated by the ninth transistor 534 from the magnitude of the current generated by the eighth transistor 533, is outputted from the second node NB. In other words, the analog output Aout has a magnitude which is obtained through subtracting the magnitude of the reference current Iref from two times the magnitude of the input current Ain. In the case where the digital output DC<n> has a low level, the tenth transistor 535 is turned off, and current with a magnitude substantially the same as two times the magnitude of the input current Ain is outputted through the second node NB as it is. The analog output Aout is inputted to a next stage 1-bit ADC.

Figure 6:
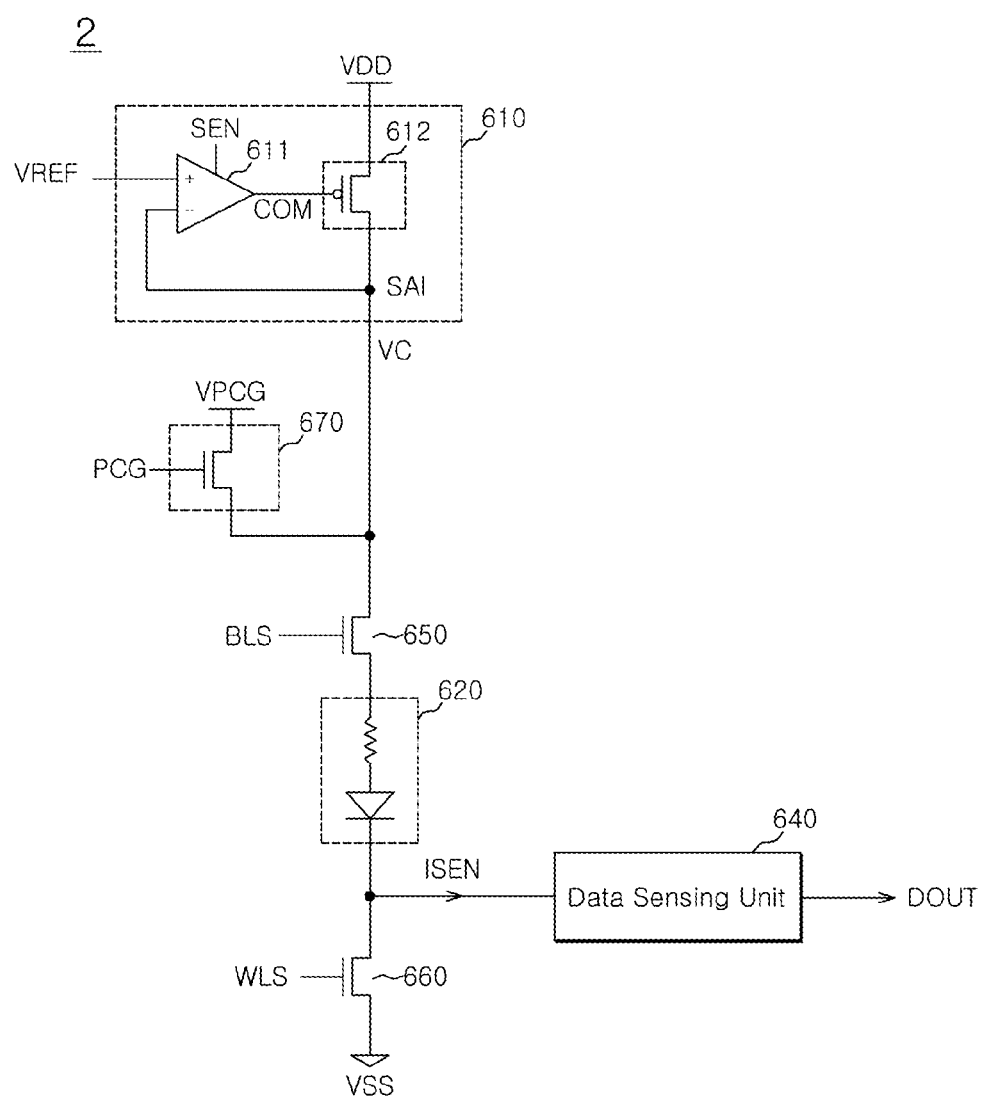
FIG. 6 is a diagram schematically showing the configuration of a nonvolatile memory apparatus in accordance with an embodiment of the present invention.

FIG. 6 is a diagram schematically showing the configuration of a nonvolatile memory apparatus 2 in accordance with an embodiment of the present invention. In FIG. 6, the nonvolatile memory apparatus 2 may include a sensing voltage generation unit 610, a memory cell 620, and a data sensing unit 640. The sensing voltage generation unit 610 may be configured to provide a sensing voltage VC with a constant level to a sensing node SAI. The sensing voltage generation unit 610 may provide the sensing voltage VC with a constant level to the sensing node SAI in response to a reference voltage VREF and the voltage of the sensing node SAI.

The memory cell 620 has one end which may be connected with the sensing node SAI. The memory cell 620 receives the sensing voltage VC from the sensing node SAI. The data sensing unit 640 may be connected with the other end of the memory cell 620. The data sensing unit 640 may be configured to sense sensing current ISEN which flows through the memory cell 620 and generate a data output signal DOUT.

Each of the conventional nonvolatile memory apparatuses 10 and 20 shown in FIGS. 1 and 2 has a configuration in which the amount of current flowing through the sensing node SAI is fixed, the voltage level of the sensing node SAI is changed according to the resistance value of each of the memory cells 11 and 21, and the data stored in each of the memory cells 11 and 21 is sensed by detecting a change in the voltage level. Conversely, in the embodiments of the present invention shown in FIG. 6, the nonvolatile memory apparatus 2 has a configuration in which the sensing node SAI is retained at the sensing voltage VC with a constant level and a change in the sensing current ISEN flowing through the memory cell 620 according to the resistance value of the memory cell 620 is sensed. Furthermore, the nonvolatile memory apparatus 2 has a configuration in which the sensing current ISEN flowing through the memory cell 620 is not sensed from the one end of the memory cell 620 connected with the sensing node SAI but is sensed from the other end of the memory cell 620.

In FIG. 6, the nonvolatile memory apparatus 2 may further include a column switch 650 and/or a row switch 660. The column switch 650 connects the one end of the memory cell 620 and the sensing node SAI with each other in response to a bit line select signal BLS. The row switch 660 may be connected with a word line, and may be connected between the other end of the memory cell 620 and a ground voltage VSS to form a current path which passes through the memory cell 620. Namely, the row switch 660 connects the memory cell 620 and the terminal of the ground voltage VSS with each other in response to a word line select signal WLS. In the detailed description of the embodiment of the present invention, the word line select signal WLS may have the same meaning as a word line, and the fact that the word line is enabled has the same meaning as the fact that the word line select signal WLS is enabled. Accordingly, reception of the word line select signal WLS may mean connection with the word line.

In the embodiment of the present invention, the data sensing unit 640 may be connected between the other end of the memory cell 620, that is, the memory cell 620, and the row switch 660. A nonvolatile memory apparatus not according to the present embodiment has a configuration in which a change in current or a voltage is sensed at the sensing node SAI and current or a voltage flowing through the sensing node SAI is copied for sensing. However, the nonvolatile memory apparatus 2 in accordance with the embodiment of the present invention has a configuration in which the current ISEN flowing through the memory cell 620 is received and sensed at the other end of the memory cell 620. As a consequence, in the nonvolatile memory apparatus 2, unlike the nonvolatile memory apparatus 1 of FIG. 3, an additional current path such as for generating copied current is not formed for current sensing. Therefore, an amount of current consumed for data sensing may be reduced. Moreover, the area efficiency of the nonvolatile memory apparatus 2 may be improved as will be described later.

In FIG. 6, similarly to the sensing voltage generation unit 110 of FIG. 3, the sensing voltage generation unit 610 may include a comparator 611 and a driver section 612. Also, the nonvolatile memory apparatus 2 may further include a precharge unit 670. Thus, the same reference characters of FIG. 3 will be used throughout FIG. 6 to refer to the same or like parts.

Figure 7:
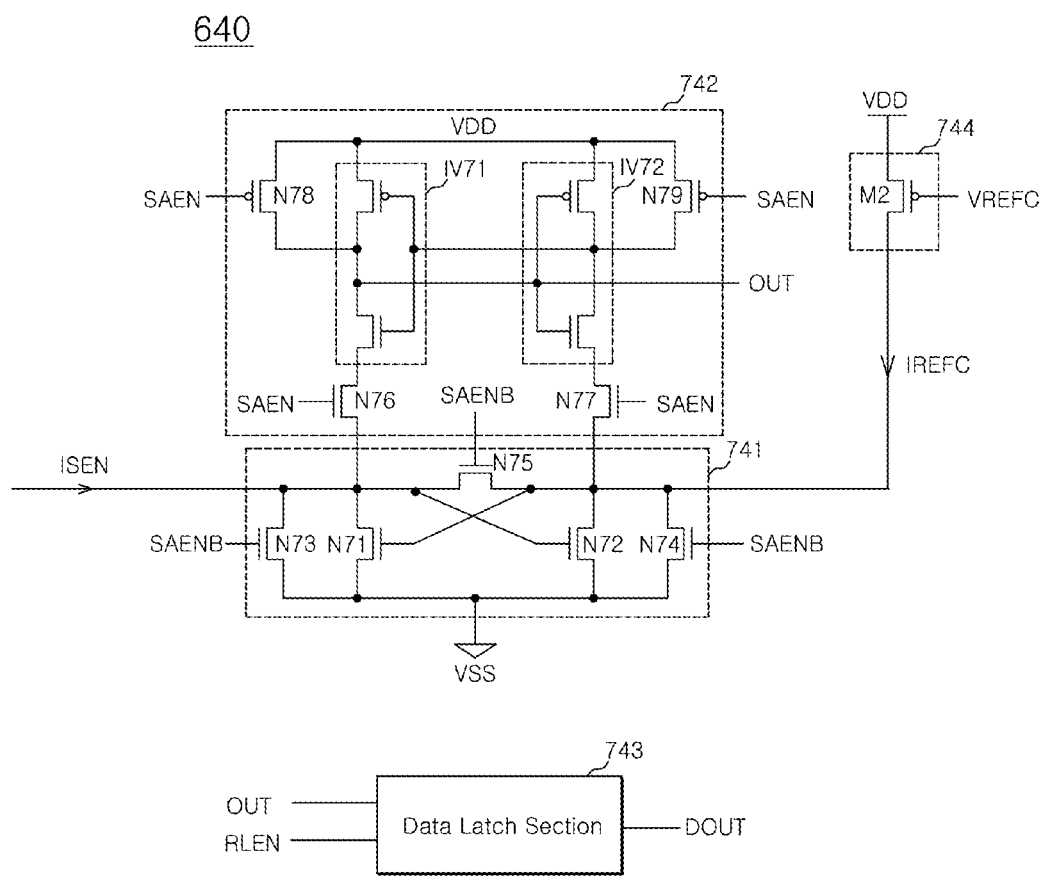
FIG. 7 is a diagram showing the configuration of an example of an embodiment of the data sensing unit of FIG. 6.

FIG. 7 is a diagram showing the configuration of an example of an embodiment of the data sensing unit 640 of FIG. 6. The data sensing unit 640 may include a current comparing section 741 and an output latch section 742. The current comparing section 741 may be configured to receive the sensing current ISEN and reference cell current IREFC and compare the magnitudes of the sensing current ISEN flowing through the memory cell 620 and the reference cell current IREFC. The output latch section 742 may be configured to generate an output signal OUT according to a comparison result of the current comparing section 741.

In FIG. 7, the current comparing section 741 may include first and second NMOS transistors N71 and N72. The first and second NMOS transistors N71 and N72 form cross-coupled structures. The first NMOS transistor N71 has a gate which receives the reference cell current IREFC, a drain which receives the sensing current ISEN and a source which may be connected with the ground voltage VSS. The second NMOS transistor N72 has a gate which receives the sensing current ISEN, a drain which receives the reference cell current IREFC and a source which may be connected with the ground voltage VSS. Through these structures, the first and second NMOS transistors N71 and N72 are selectively turned on according to the magnitudes of the sensing current ISEN and the reference cell current IREFC. The current comparing section 741 further may include a precharge switch. The precharge switch may include third to fifth NMOS transistors N73, N74 and N75. The third and fourth NMOS transistors N73 and N74 receive a precharge control signal through the respective gates thereof and connect the drains of the first and second NMOS transistors N71 and N72 with the ground voltage VSS in response to the precharge control signal. The fifth NMOS transistor N75 receives the precharge control signal through the gate thereof and connects the drains of the first and second NMOS transistors N71 and N72 with each other in response to the precharge control signal. Thus, the precharge switch causes the current comparing section 741 not to compare the magnitudes of the sensing current ISEN and the reference cell current IREFC when the precharge control signal is enabled. The precharge control signal may be generated from a comparison enable signal SAEN. The precharge control signal may be a signal SAENB which is generated by inverting the comparison enable signal SAEN. The comparison enable signal SAEN may be generated from the aforementioned read command.

The output latch section 742 may include first and second inverters IV71 and IV72. The first inverter IV71 has a first power supply terminal which receives a power supply voltage VDD and a second power supply terminal which may be connected with the drain of the first NMOS transistor N71. The first inverter IV71 receives the output of the second inverter IV72 through the input terminal thereof and may be connected with the power supply voltage VDD through the output terminal thereof. The output of the first inverter IV71 is provided as the output signal OUT. The second inverter IV72 has a first power supply terminal which receives the power supply voltage VDD and a second power supply terminal which may be connected with the drain of the second NMOS transistor N72. The second inverter IV72 receives the output of the first inverter IV71 through the input terminal thereof, and outputs an output by inverting the output of the first inverter IV71.

The output latch section 742 further may include an enable switch. The enable switch may include sixth to ninth NMOS transistors N76, N77, N78 and N79. The sixth NMOS transistor N76 receives the comparison enable signal SAEN through the gate thereof, and connects the second power supply terminal of the first inverter IV71 and the drain of the first NMOS transistor N71 in response to the comparison enable signal SAEN. The seventh NMOS transistor N77 receives the comparison enable signal SAEN through the gate thereof, and connects the second power supply terminal of the second inverter IV72 and the drain of the second NMOS transistor N72 in response to the comparison enable signal SAEN. The eighth NMOS transistor N78 receives the comparison enable signal SAEN through the gate thereof, and provides the power supply voltage VDD to the output terminal of the first inverter IV71 and the input terminal of the second inverter IV72 in response to the comparison enable signal SAEN. The ninth NMOS transistor N79 receives the comparison enable signal SAEN through the gate thereof, and provides the power supply voltage VDD to the input terminal of the first inverter IV71 and the output terminal of the second inverter IV72 in response to the comparison enable signal SAEN.

The data sensing unit 640 further may include a data latch section 743. The data latch section 743 receives the output signal OUT of the output latch section 742 and a read enable signal RLEN. The data latch section 743 provides the output signal OUT of the output latch section 742 as the data output signal DOUT when the read enable signal RLEN is enabled. The read enable signal RLEN may be generated from the aforementioned read command.

The data sensing unit 640 may further include a reference cell current generating section 744. The reference cell current generating section 744 may receive a reference cell voltage VREFC and generate the reference cell current IREFC. The reference cell voltage VREFC may be generated from a reference cell (not shown). The reference cell current generating section 744 may include a second MOS transistor M2. The second MOS transistor M2 has a gate which receives the reference cell voltage VREFC, a source which receives the power supply voltage VDD and a drain which generates the reference cell current IREFC.

Operations of the data sensing unit 640 will be described below. The current comparing section 741 turns on the third to fifth NMOS transistors N73, N74 and N75 and does not compare the magnitudes of the sensing current ISEN and the reference cell current IREFC, before the comparison enable signal SAEN is enabled. Thereafter, if the comparison enable signal SAEN is enabled, the third to fifth NMOS transistors N73, N74 and N75 and the eighth and ninth NMOS transistors N78 and N79 are turned off and the sixth and seventh NMOS transistors N76 and N77 are turned on, and the magnitudes of the sensing current ISEN and the reference cell current IREFC are compared. In the case where the magnitude of the sensing current ISEN is larger than the magnitude of the reference cell current IREFC, the second NMOS transistor N72 is turned on and the first NMOS transistor N71 is turned off. Accordingly, the second power supply terminal of the second inverter IV72 receives the ground voltage VSS. Since the first inverter IV71 cannot receive the ground voltage VSS through the second power supply terminal, the output latch section 742 may generate the output signal OUT of a high level. Therefore, the data latch section 743 may latch the output of the output latch section 742 and generate the data output signal DOUT of a high level when the read enable signal RLEN is enabled. Conversely, in the case where the magnitude of the sensing current ISEN is smaller than the magnitude of the reference cell current IREFC, the first NMOS transistor N71 is turned on and the second NMOS transistor N72 is turned off. Accordingly, the first power supply terminal of the first inverter IV71 receives the ground voltage VSS. Hence, the output latch section 742 may generate the output signal OUT of a low level. Therefore, the data latch section 743 may latch the output signal OUT of the output latch section 742 and generate the data output signal DOUT of a low level when the read enable signal RLEN is enabled.

Figure 8:
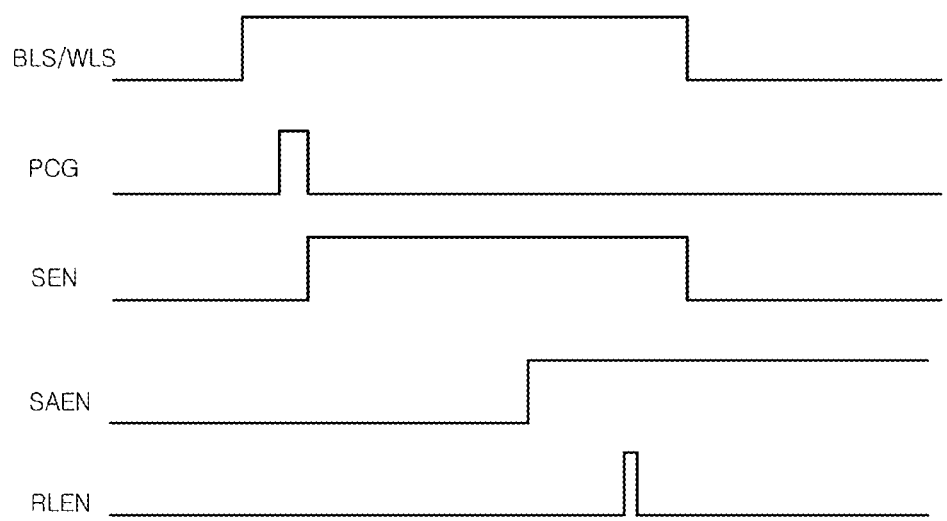
FIG. 8 is a timing diagram showing operations of the nonvolatile memory apparatus of FIG. 6.

FIG. 8 is a timing diagram showing operations of the nonvolatile memory apparatus 2 of FIG. 6. Operations of the nonvolatile memory apparatus 2 in accordance with the embodiments of the present invention will be described below with reference to FIGS. 6 to 8. First, in order to access the data stored in a desired memory cell, the bit line select signal BLS and the word line select signal WLS are enabled.

If the memory cell 620 is selected by the bit line select signal BLS and the word line select signal WLS, a sensing enable signal SEN is enabled from a read command to sense the data stored in the memory cell 620. The sensing voltage generation unit 610 provides the sensing voltage VC with a constant level to the sensing node SAI. If the sensing voltage VC is provided, the magnitude of the sensing current ISEN flowing through the memory cell 620 is changed according to the resistance value of the memory cell 620 (that is, according to the value of the data stored in the memory cell 620).

At this time, the current comparing section 741 does not compare the magnitudes of the sensing current ISEN and the reference cell current IREFC in response to the comparison enable signal SAEN which is disabled. After the sensing current ISEN is sufficiently changed according to the resistance value of the memory cell 620, the comparison enable signal SAEN is enabled. The output latch section 742 may generate the output signal OUT of the high level or the low level according to a result of comparing the sensing current ISEN and the reference cell current IREFC, and the data latch section 743 may output the data output signal DOUT of the high level or the low level by latching the output signal OUT of the output latch section 742 in response to the read enable signal RLEN. Additionally, when the precharge signal PCG is enabled, the precharge unit 670 provides the precharge voltage VPCG to the sensing node SAI and raises the voltage level of the sensing node SAI.

Figure 9:
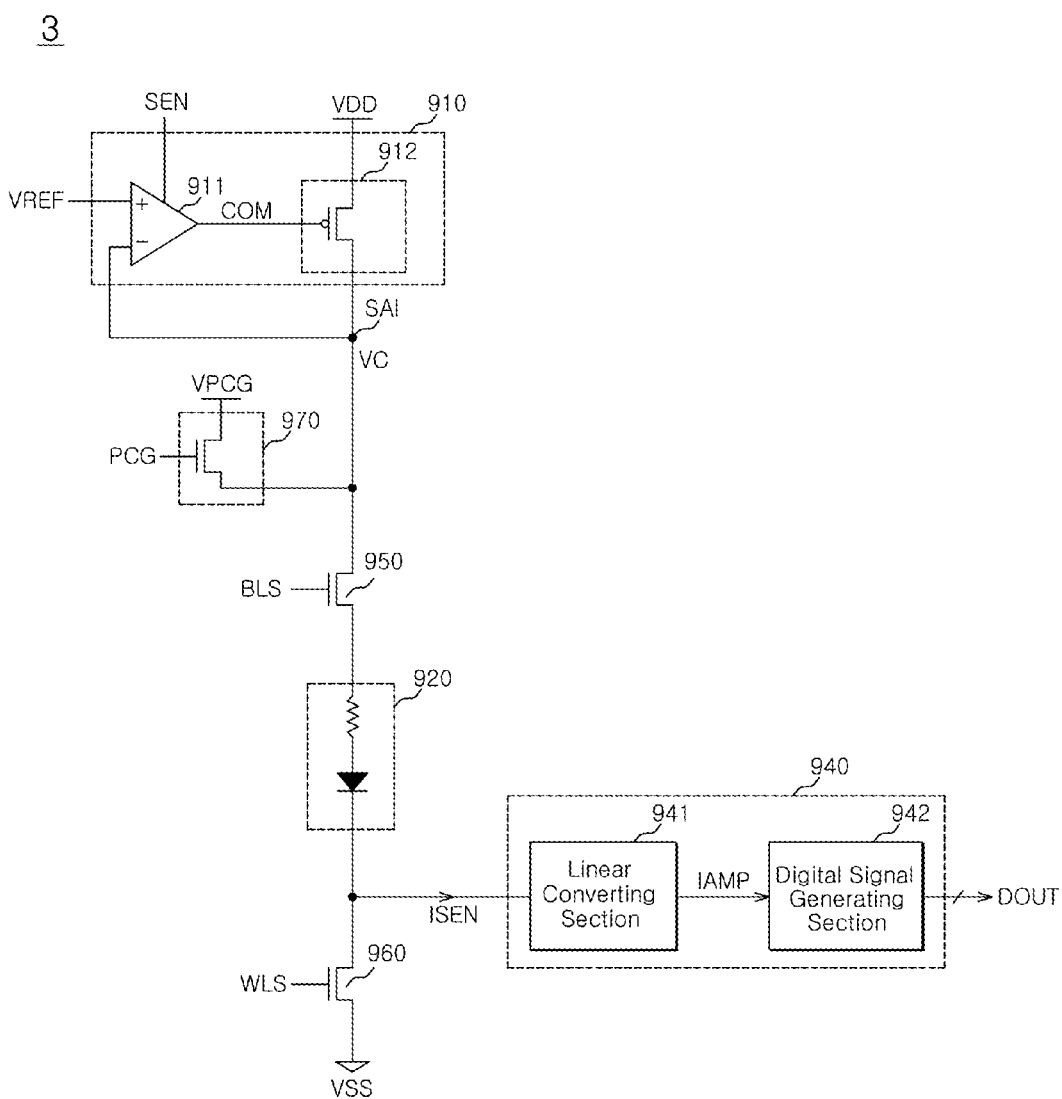
FIG. 9 is a diagram schematically showing the configuration of a nonvolatile memory apparatus in accordance with an embodiment of the present invention.

FIG. 9 is a diagram schematically showing the configuration of a nonvolatile memory apparatus 3 in accordance with an embodiment of the present invention. In FIG. 9, the nonvolatile memory apparatus 3 may include a sensing voltage generation unit 910, a memory cell 920, and a data sensing unit 940. The sensing voltage generation unit 910 may include a comparator 911 and a driver section 912, and may have the same configuration as the sensing voltage generation unit 110 of FIG. 3. Thus, the same reference characters of FIG. 3 will be used throughout FIG. 9 to refer to the same or like parts. The memory cell 920 has one end which may be connected with a sensing node SAI and receives a sensing voltage VC with a constant level which is generated in the sensing voltage generation unit 910, from the sensing node SAI.

The data sensing unit 940 receives sensing current ISEN which flows through the memory cell 920, at the other end of the memory cell 920. The data sensing unit 940 receives the sensing current ISEN and generates a multi-bit data output signal DOUT.

The nonvolatile memory apparatus 3 may further include a column switch 950, a row switch 960 and a precharge unit 970, and these components are the same as those of the nonvolatile memory apparatus 1 of FIG. 3. Thus, the same reference characters of FIG. 3 will be used throughout FIG. 9 to refer to the same or like parts. While the data sensing unit 140 may be connected with the sensing node SAI in the nonvolatile memory apparatus 1 of FIG. 3, the data sensing unit 940 in the nonvolatile memory apparatus 3 of FIG. 9 may be connected with the other end of the memory cell 920. The data sensing unit comprises a linear converting section 941 which may receive a sensing current ISEN and a digital signal generating section 942 which may receive the current amplification signal IAMP and output multi-bit data output signal DOUT. That is to say, the data sensing unit 940 receives the sensing current ISEN on a word line side. As described above, the nonvolatile memory apparatus 3 in accordance with the embodiment of the present invention has a configuration in which the sensing voltage VC with a constant level is provided to the memory cell 920 and the sensing current ISEN which is changed according to the resistance value of the memory cell 920 is sensed.

Figure 10:
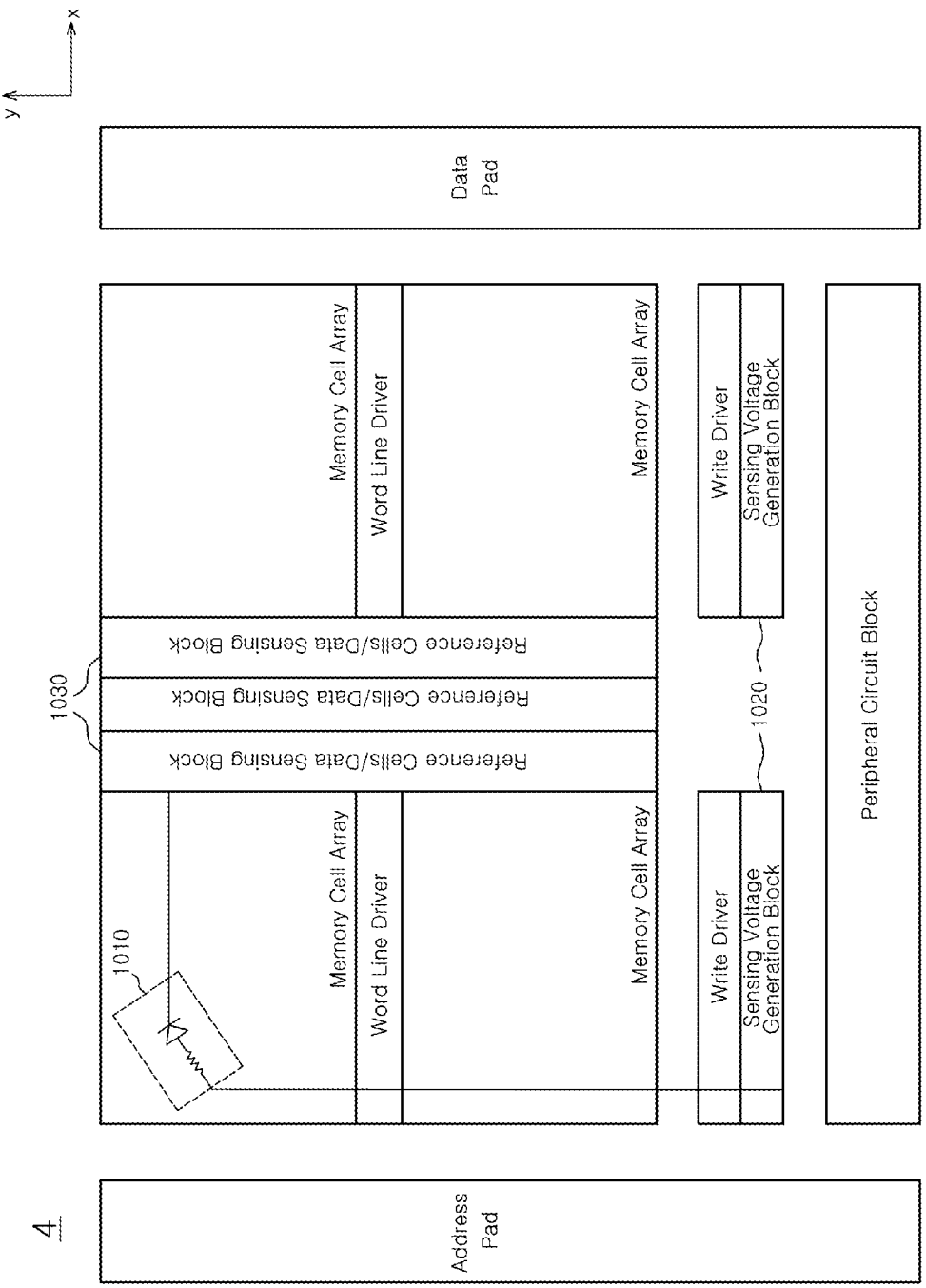
FIG. 10 is a block diagram showing the entire configuration of a nonvolatile memory apparatus to which the nonvolatile memory apparatus of FIG. 6

FIG. 10 is a block diagram showing the entire configuration of a nonvolatile memory apparatus 4 to which the nonvolatile memory apparatus 2 or 3 of FIG. 6 or FIG. 9 is applied. In FIG. 10, the nonvolatile memory apparatus 4 may include memory cell arrays, and each memory cell array may include a plurality of memory cells 1010. The plurality of memory cells 1010 may be connected with a plurality of bit lines and a plurality of word lines.

Pads may be disposed on both sides of the memory cell arrays in the x direction. While the pads are exemplified as an address pad and a data pad, the present invention is not limited to such, and all kinds of pads such as a power pad, a command pad, a clock pad, and so forth may be included. Write drivers, sensing voltage generation blocks 1020 and a peripheral circuit block may be disposed below the memory cell arrays in the y direction. Each of the sensing voltage generation blocks 1020 may include a plurality of sensing voltage generation units and may provide sensing voltages to the memory cells 1010 which are included in each memory cell array.

A global bit line decoder and data sensing blocks 1030 are disposed between the memory cell arrays in the x direction. Word line drivers may be disposed between the memory cell arrays in the y direction. The global bit line decoder may generate a bit line select signal. Each of the word line drivers may generate a word line select signal or may enable a word line. Each of the data sensing blocks 1030 may include a plurality of current sensing units and may sense current which flows through the memory cells 1010. In a conventional nonvolatile memory apparatus, all read sense amplifiers for read operations of semiconductor devices exist at the positions of the sensing voltage generation blocks 1020 of FIG. 10. In the embodiment of the present invention, the sensing voltage generation blocks 1020 and the data sensing blocks 1030 for read operations of the nonvolatile memory apparatus 4 are separately disposed from each other. Since the data sensing blocks 1030 may be connected between the other ends of the memory cells 1010 and the word lines, they may be disposed separately from the sensing voltage generation blocks 1020. Accordingly, it is possible to secure an area for disposing circuits in the peripheral region of the nonvolatile memory apparatus 4, and, because paths for sensing the data stored in the memory cells 1010 are shortened in comparison with the conventional art, it is possible to sense data in a precise and quick manner.

Reference cells may be disposed in the data sensing blocks 1030. The reference cells which are disposed in the data sensing blocks 1030 may provide reference cell voltages to data sensing units. While it is exemplified in FIG. 10 that the reference cells are disposed in the data sensing blocks 1030, it is to be noted that the present invention is not limited to such. In an embodiment, the reference cells may be disposed in the memory cell arrays. In the case where the reference cells are disposed in the memory cell arrays, since the reference cell voltages may be provided under the same Process, Voltage and Temperature (PVT) varying conditions as the memory cells 1010, precise reference cell voltages may be generated.

Figure 11:
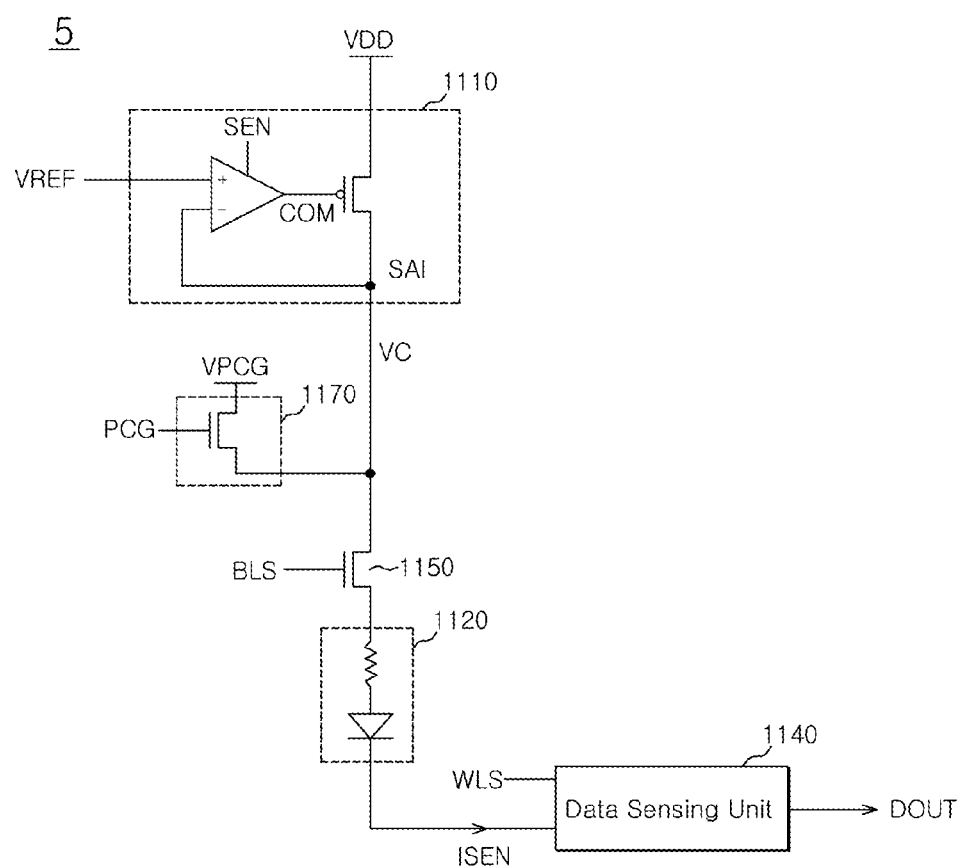
FIG. 11 is a diagram schematically showing the configuration of a nonvolatile memory apparatus in accordance with an embodiment of the present invention.

FIG. 11 is a diagram schematically showing the configuration of a nonvolatile memory apparatus 5 in accordance with an embodiment of the present invention. In FIG. 11, the nonvolatile memory apparatus 5 may include a sensing voltage generation unit 1110, a memory cell 1120, and a data sensing unit 1140. The nonvolatile memory apparatus 5 may further include a bit line switch 1150 and a precharge unit 1170. The sensing voltage generation unit 1110, the memory cell 1120, the bit line switch 1150 (i.e., column switch 650) and the precharge unit 1170 are the same as those of the nonvolatile memory apparatus 2 of FIG. 6. Thus, the same reference characters of FIG. 6 will be used throughout FIG. 11 to refer to the same or like parts.

In FIG. 11, the data sensing unit 1140 may be connected with a word line and the other end of the memory cell 1120. The data sensing unit 1140 may be configured to sense sensing current ISEN which flows through the memory cell 1120, in response to a word line select signal WLS. The data sensing unit 1140 is activated when the word line select signal WLS is enabled or a word line is enabled, and receives the sensing current ISEN flowing through the memory cell 1120 when activated. Also, the data sensing unit 1140, which senses the sensing current ISEN flowing through the memory cell 1120, generates a data output signal DOUT. Accordingly, as the nonvolatile memory apparatus 5 may include the data sensing unit 1140 which directly receives the word line select signal WLS, it is not necessary to provide a row switch, unlike the nonvolatile memory apparatus 2 of FIG. 6. Therefore, since a row switch may be omitted in the nonvolatile memory apparatus 5, the nonvolatile memory apparatus 5 may secure a wider circuit area than the nonvolatile memory apparatus 2.

The word line select signal WLS which is used in the nonvolatile memory apparatus 5 may be disabled earlier than a bit line select signal BLS. The word line select signal WLS may have a narrower pulse width than a general word line select signal which is generated on the basis of a row address signal. In other words, because the word line select signal WLS is directly inputted to the data sensing unit 1140, a configuration is made such that the word line select signal WLS is disabled earlier than the bit line select signal BLS to allow the sensing current ISEN flowing through the memory cell 1120 to be sensed by the data sensing unit 1140.

Figure 12:
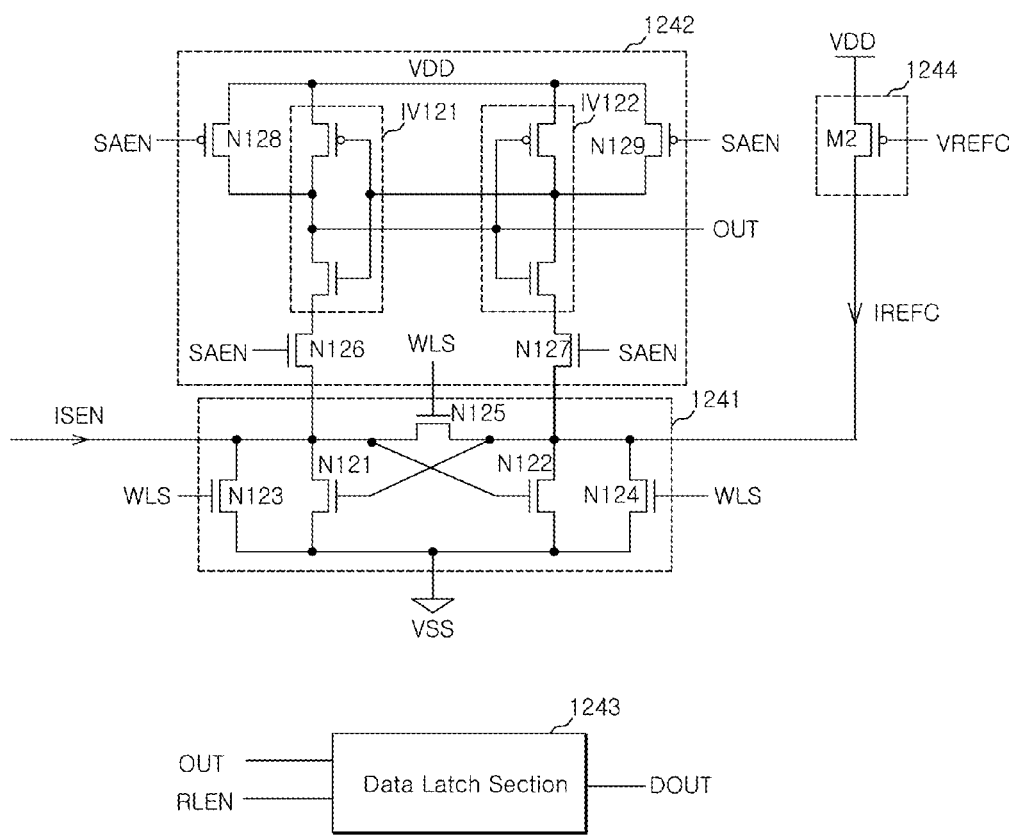
FIG. 12 is a diagram showing the configuration of an example of an embodiment of the data sensing unit of FIG. 11.

FIG. 12 is a diagram showing the configuration of an example of an embodiment of the data sensing unit 1140 of FIG. 11. In FIG. 12, the data sensing unit 1140 has the same configuration as the data sensing unit 640 of FIG. 6 except that third to fifth NMOS transistors N123, N124 and N125 constituting a current comparing section 1241 receive the word line select signal WLS instead of a precharge control signal. The third to fifth NMOS transistors N123, N124 and N125 are turned on in response to the word line select signal WLS. If the third to fifth NMOS transistors N123, N124 and N125 are turned on, a current path is formed from the sensing voltage generation unit 1110 through the memory cell 1120 to a ground voltage VSS. Accordingly, when the third to fifth NMOS transistors N123, N124 and N125 are turned on in response to the word line select signal WLS, the data sensing unit 1140 may receive the sensing current ISEN which flows through the memory cell 1120. Thereafter, when the word line select signal WLS is disabled and a comparison enable signal SAEN is enabled, the data sensing unit 1140 may compare the sensing current ISEN flowing through the memory cell 1120 and reference cell current IREFC and generate the data output signal DOUT. Additionally, in FIG. 12, reference characters N126, N127, N128, and N129 correspond to sixth to ninth NMOS transistors, respectively. In FIG. 12, N121, N122, N123, N124, and N125 correspond to first to fifth NMOS transistors, respectively. Also, the output latch section 1242 may include first and second inverters IV121 and IV122. The reference cell current generating section 1244 may include a second MOS transistor M2. The second MOS transistor M2 has a gate which receives the reference cell voltage VREFC, a source which receives the power supply voltage VDD and a drain which generates the reference cell current IREFC. Finally, the same reference characters of FIG. 7 may be used throughout FIG. 9 to refer to the same or like parts (i.e., VDD, OUT, RLEN, etc.).

Figure 13:
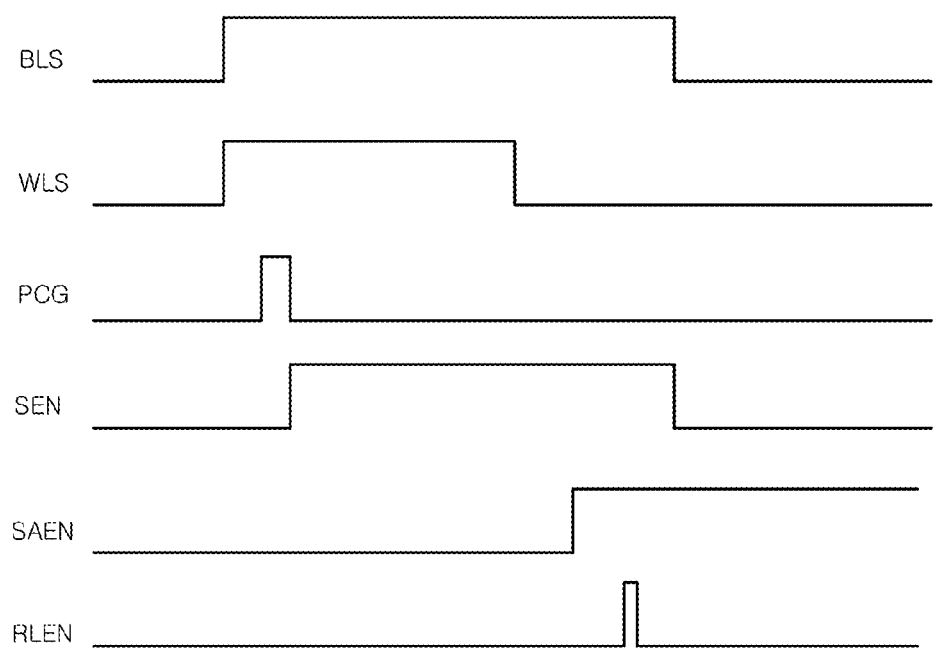
FIG. 13 is a timing diagram showing operations of the nonvolatile memory apparatus of FIG. 11.

FIG. 13 is a timing diagram showing operations of the nonvolatile memory apparatus 5 of FIG. 11. Operations of the nonvolatile memory apparatus 5 in accordance with the embodiments of the present invention will be described below with reference to FIGS. 11 to 13. First, in order to access the data stored in a desired memory cell, the bit line select signal BLS and the word line select signal WLS are enabled.

If the bit line select signal BLS is enabled, a sensing enable signal SEN is enabled from a read command to sense the data stored in the memory cell 1120. The sensing voltage generation unit 1110 provides a sensing voltage VC with a constant level to a sensing node SAI.

At this time, the current comparing section 1241 is activated in response to the word line select signal WLS. If the current comparing section 1241 is activated, a path through which current may flow is formed through the memory cell 1120, and the magnitude of the sensing current ISEN flowing through the memory cell 1120 is changed according to the resistance value of the memory cell 1120 (that is, according to the value of the data stored in the memory cell 1120). The current comparing section 1241 receives the sensing current ISEN flowing through the specified memory cell 1120 which may be connected with the word line. Then, the word line select signal WLS is disabled, and the comparison enable signal SAEN is enabled. An output latch section 1242 may generate an output signal OUT of a high level or a low level according to a result of comparing the sensing current ISEN and the reference cell current IREFC, and a data latch section 1243 may latch the output signal OUT of the output latch section 1242 in response to a read enable signal RLEN and output the data output signal DOUT of a high level or a low level. Additionally, when the precharge signal PCG is enabled, the precharge unit 1170 provides the precharge voltage VPCG to the sensing node SAI and raises the voltage level of the sensing node SAI.

Figure 14:
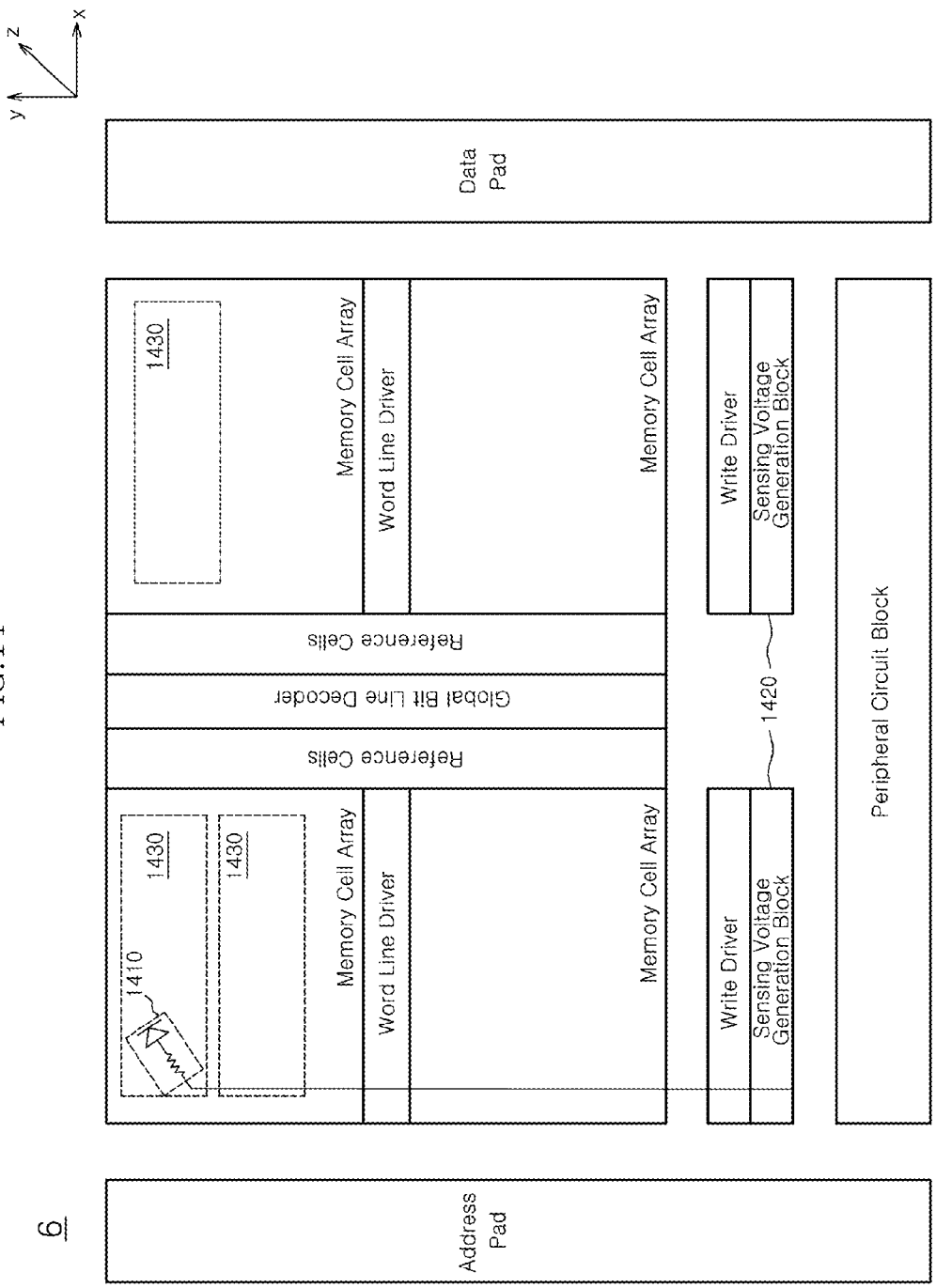
FIG. 14 is a block diagram showing the entire configuration of a nonvolatile memory apparatus to which the nonvolatile memory apparatus of FIG. 11 is applied.

FIG. 14 is a block diagram showing the entire configuration of a nonvolatile memory apparatus 6 to which the nonvolatile memory apparatus 5 of FIG. 11 is applied. In FIG. 14, the dispositions of memory cell arrays, an address pad, a data pad, write drivers, sensing voltage generation blocks 1420, a peripheral circuit block, a global bit line decoder and word line drivers are the same as the nonvolatile memory apparatus 4 shown in FIG. 10. Reference cells may be disposed between the memory cell arrays in the x direction. In an embodiment, the reference cells may be disposed in the memory cell arrays.

In FIG. 14, data sensing blocks 1430 may be disposed in lower portions of the memory cell arrays in the z direction. Since data sensing units included in each of the data sensing blocks 1430 are connected with word lines and the other ends of memory cells 1410, the data sensing blocks 1430 may be disposed in the lower portions of the memory cell arrays as in FIG. 11. In the case where the data sensing blocks 1430 are disposed in the lower portions of the memory cell arrays, since the circuits of the data sensing blocks 1430 may be removed on a plane on which the memory cell arrays are disposed, design may be easily performed and a circuit area may be secured. Moreover, because sensing may be implemented by directly receiving current flowing through the memory cells 1410, data may be sensed in a precise and quick manner.

Figure 15:
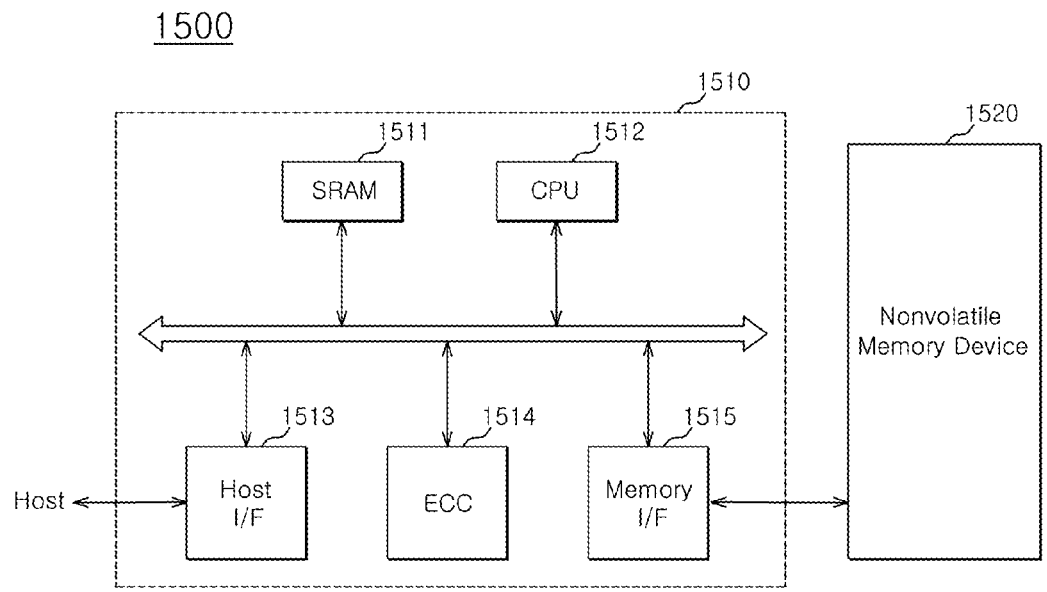
FIG. 15 is a view illustrating a memory system according to an embodiment of the present invention.

FIG. 15 is a block diagram illustrating a memory system according to an embodiment of the present invention.

In FIG. 15, the memory system 1500 of the present embodiment may include a nonvolatile memory device 1520 and a memory controller 1510.

The nonvolatile memory device 1520 or nonvolatile memory may include the nonvolatile memory apparatuses described above. The nonvolatile memory device 1520 may be a multi-chip package having flash memory chips.

The memory controller 1510 controls the nonvolatile memory device 1520, and may include an SRAM 1511, a CPU 1512, a host interface 1513, an ECC 1514 and a memory interface 1515. The SRAM 1511 is used as an operation memory of the CPU 1512, the CPU 1512 performs control operation for data exchange of the memory controller 1510, and the host interface 1513 has data exchange protocol of a host accessed to the memory system 1500. The ECC 1514 detects and corrects error of data read from the nonvolatile memory device 1520, and the memory interface 1515 interfaces with the nonvolatile memory device 1520. The memory controller 1510 may include further ROM for storing data for interfacing with the host, etc.

The memory system 1500 may be used as a memory card or a solid state disk SSD by combination of the nonvolatile memory device 1520 and the memory controller 1510. In the event that the memory system 1500 is the SSD, the memory controller 1510 communicates with an external device, e.g. host through one of various interface protocols such as USB, MMC, PCI-E, SATA, PATA, SCSI, ESDI, IDE, etc.

Figure 16:
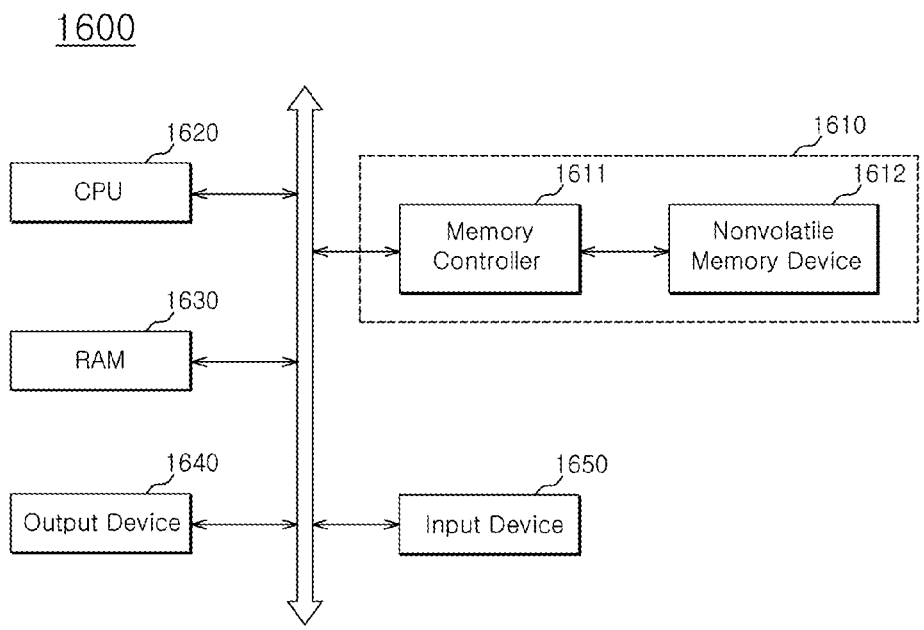
FIG. 16 is a view illustrating a computing system according to an embodiment of the present invention.

FIG. 16 is a view illustrating a computing system according to an embodiment of the present invention.

In FIG. 16, the computing system 1600 of the present embodiments may include a CPU 1620 connected electrically to a system bus 1660, a RAM 1630, a user interface 1640, an input device 1650 and a memory system 1610. In case that the computing system 1600 is a mobile device, a battery (not shown) for supplying an operation voltage to the computing system 1600 may be further provided. The computing system 1600 of the present invention may further include an application chipset, a CMOS image processor CIS, a mobile DRAM, etc.

The output device 1640 may be a self-contained display in the case of a portable electronic device. The input device 1650 may be a physical keyboard or a virtual keyboard in the case of a portable electronic device, and may further include, without limitation, a trackball, touchpad, or other cursor control device combined with a selection control, such as a pushbutton, to select an item highlighted by cursor manipulation. The memory system 1610 may include a nonvolatile memory or nonvolatile memory device 1612 and a memory controller 1611 as described in FIG. 15.

While various embodiments have been described above, it will be understood to those skilled in the art that the embodiments described are by way of example only. Accordingly, the nonvolatile memory apparatus described herein should not be limited based on the described embodiments. Rather, the nonvolatile memory apparatus described herein should only be limited in light of the claims that follow when taken in conjunction with the above description and accompanying drawings.

What is claimed is:

1. A nonvolatile memory apparatus comprising:
a sensing voltage generation unit configured to provide a sensing voltage with a constant level, to a sensing node;
a memory cell connected with the sensing node at one end thereof and configured to receive the sensing voltage;
a column switch configured to connect the sensing node and the one end of the memory cell in response to a bit line select signal;
a row switch configured to connect the other end of the memory cell with a ground voltage in response to a word line select signal; and
a data sensing unit connected between the other end of the memory cell and the row switch, and configured to sense sensing current which flows through the memory cell and generate a data output signal.

2. The nonvolatile memory apparatus according to claim 1, wherein the sensing voltage generation unit comprises:
a comparator configured to compare a reference voltage and a voltage level of the sensing node and generate a comparison signal; and
a driver section configured to provide a power supply voltage to the sensing node in response to the comparison signal and generate the sensing voltage.

3. The nonvolatile memory apparatus according to claim 2, wherein the driver section comprises a MOS transistor having a gate which receives the comparison signal, and a drain and a source one of which receives the power supply voltage and the other of which is connected with the sensing node.

4. The nonvolatile memory apparatus according to claim 1, wherein the data sensing unit compares magnitudes of the sensing current and reference cell current which is generated from a reference cell, and generates the data output signal.

5. The nonvolatile memory apparatus according to claim 1, wherein the data sensing unit receives the sensing current which flows through the memory cell, and generates a multi-bit data output signal.

6. The nonvolatile memory apparatus according to claim 5, wherein the data sensing unit comprises:
a linear converting section configured to receive the sensing current and generate a current amplification signal; and
a digital signal generating section configured to receive the current amplification signal and generate the multi-bit data output signal.

7. The nonvolatile memory apparatus according to claim 6, wherein the linear converting section comprises a log-tolinear converter which converts the sensing current with a log scale into the current amplification signal with a linear scale.

8. The nonvolatile memory apparatus according to claim 6, wherein the digital signal generating section comprises:
   an analog-to-digital converter configured to generate a multi-bit digital signal from the current amplification signal; and
   an output part configured to encode the multi-bit digital signal and generate the multi-bit data output signal.

9. The nonvolatile memory apparatus according to claim 1, wherein the data sensing unit receives current which flows through the memory cell, between the other end of the memory cell and the row switch.

10. The nonvolatile memory apparatus according to claim 1, wherein the data sensing unit senses the sensing current and generates the data output signal when activated in response to the word line select signal.

* * * * *